(12) United States Patent
Yin et al.

(10) Patent No.: US 6,573,175 B1
(45) Date of Patent: Jun. 3, 2003

(54) DRY LOW K FILM APPLICATION FOR INTERLEVEL DIELECTRIC AND METHOD OF CLEANING ETCHED FEATURES

(75) Inventors: Zhiping Yin, Boise, ID (US); Gary Chen, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/998,729

(22) Filed: Nov. 30, 2001

(51) Int. Cl.[7] .......................................... H01L 21/4763
(52) U.S. Cl. ...................................................... 438/637
(58) Field of Search .................................. 438/745, 750, 438/756, 636, 637

(56) References Cited

U.S. PATENT DOCUMENTS

| | | | |
|---|---|---|---|
| 5,698,352 A | 12/1997 | Ogawa et al. | 430/14 |
| 5,741,626 A | 4/1998 | Jain et al. | 430/314 |
| 5,783,495 A | 7/1998 | Li et al. | 438/738 |
| 5,981,401 A | 11/1999 | Torek et al. | 438/745 |
| 6,044,851 A | 4/2000 | Grieger et al. | 134/1.3 |
| 6,103,637 A * | 8/2000 | Torek et al. | 438/745 |
| 6,107,686 A | 8/2000 | Sandhu et al. | 257/758 |
| 6,114,259 A | 9/2000 | Sukharev et al. | 438/789 |
| 6,144,083 A | 11/2000 | Yin | 257/437 |
| 6,156,674 A | 12/2000 | Li et al. | 438/780 |
| 6,162,738 A | 12/2000 | Chen et al. | 438/745 |
| 6,174,590 B1 | 1/2001 | Iyer et al. | 428/209 |
| 6,194,315 B1 | 2/2001 | Hu et al. | 438/683 |
| 6,225,671 B1 | 5/2001 | Yin | 257/437 |
| 6,268,282 B1 | 7/2001 | Sandhu et al. | 438/636 |
| 6,274,292 B1 | 8/2001 | Holscher et al. | 430/313 |
| 6,281,100 B1 | 8/2001 | Yin et al. | 438/585 |
| 6,291,363 B1 | 9/2001 | Yin et al. | 438/769 |
| 6,294,457 B1 * | 9/2001 | Liu | 438/623 |
| 6,294,459 B1 | 9/2001 | Yin et al. | 438/636 |
| 6,319,835 B1 * | 11/2001 | Sahbari et al. | 438/689 |
| 6,350,700 B1 * | 2/2002 | Schinella et al. | 438/723 |
| 6,372,614 B2 * | 4/2002 | Rangarajan et al. | 438/586 |
| 6,380,096 B2 * | 4/2002 | Hung et al. | 438/723 |
| 6,391,768 B1 * | 5/2002 | Lee et al. | 438/633 |
| 6,391,794 B1 * | 5/2002 | Chen et al. | 438/745 |
| 6,410,437 B1 * | 6/2002 | Flanner et al. | 438/689 |
| 6,417,112 B1 * | 7/2002 | Peyne et al. | 438/754 |

* cited by examiner

*Primary Examiner*—David Nelms
*Assistant Examiner*—Quoc Hoang
(74) *Attorney, Agent, or Firm*—Whyte Hirschboeck Dudek SC

(57) ABSTRACT

Methods of selectively removing post-etch polymer material and dielectric antireflective coatings (DARC) without substantially etching an underlying carbon-doped low k dielectric layer, and compositions for the selective removal of a DARC layer and post-etch polymer material are provided. A composition comprising trimethylammonium fluoride is used to selectively etch a dielectric antireflective coating layer overlying a low k dielectric layer at an etch rate of the antireflective coating layer to the low k dielectric layer that is greater than the etch rate of the antireflective coating to a TEOS layer. The method and composition are useful, for example, in the formation of high aspect ratio openings in low k (carbon doped) silicon oxide dielectric layers and maintaining the integrity of the dimensions of the formed openings during a cleaning step to remove a post-etch polymer and antireflective coating.

78 Claims, 5 Drawing Sheets

DRY LOW K FILM APPLICATION FOR INTERLEVEL DIELECTRIC AND METHOD OF CLEANING ETCHED FEATURES

FIELD OF THE INVENTION

The present invention relates generally to semiconductor device fabrication, and more particularly to methods of removing post-etch polymer and dielectric antireflective coatings without substantially etching the underlying dielectric layer, and solutions used in such methods.

BACKGROUND OF THE INVENTION

The continuing trend in the semiconductor industry toward densification of circuit devices has significantly improved performance of electronic devices that use integrated circuits. In a typical integrated circuit, individual circuit elements are electrically connected together by a metallization process in which layers of metal are deposited and patterned to form metal lines that complete the circuit as designed. Multiple metal layers are often employed. Metal lines within patterned metal layers are insulated by interlevel dielectric layers from undesired electrical contact both with other metal lines, whether in the same or another metal layer, and with other circuit elements.

In the construction of integrated circuit structures, dielectric materials such as silicon oxide ($SiO_2$) have been conventionally used to electrically separate conductive elements of the integrated circuit structure. The increasing density of integrated circuits has resulted in unneeded capacitance between metal lines in an integrated circuit which slows circuit speed and can cause cross-coupling between adjacent conductive elements.

The use of insulation materials having lower dielectric constants (k values) than conventional silicon oxide ($SiO_2$) have been described. One such class of material is a carbon doped silicon oxide material wherein at least a portion of the oxygen atoms bonded to the silicon atoms are replaced by one or more organic groups, for example, an alkyl group such as a methyl ($CH_3$) group. Such low k carbon doped silicon oxide dielectric materials have dielectric constants varying from about 2.5 to about 3.5, and lowers the capacitance between conductive elements separated by such dielectric materials.

In connecting overlying layers of metal lines separated by a carbon-doped $SiO_2$ interlayer dielectric (ILD) layer, a photolithographic technique is used that typically employs a dielectric antireflective coating (DARC) layer and an overlying photoresist layer. High aspect ratio features such as vias/trenches that are etched through the ILD layer to an underlying metal line are subsequently cleaned to remove post-etch polymer and the DARC layer before depositing the metal fill. Current cleaning compositions etch a portion of the ILD layer during the cleaning step, which can have a negative impact on and significantly alter the critical dimensions of the etched feature.

Therefore, a need exists for a cleaning composition and process that overcomes such problems.

SUMMARY OF THE INVENTION

The present invention provides methods of selectively removing dielectric antireflective coatings (DARC) without substantially etching the underlying dielectric layer, for example, in the formation of conductive contacts in a semiconductor structure. The invention further provides compositions for the selective removal of post-etch polymer and a DARC layer. The method and composition help prevent degradation of the exposed surfaces of a low k carbon doped silicon oxide dielectric material during removal of post-etch polymer and antireflective coating after formation of vias or contact openings in the dielectric material.

In one aspect, the invention provides a method of cleaning a wafer surface. In one embodiment, the method comprises contacting a wafer substrate having overlying layers of a carbon-doped low k dielectric layer, a dielectric antireflective coating layer, and post-etch polymer material, with a cleaning solution to selectively remove the antireflective coating layer and the post-etch polymer, with substantially no etching of the low k dielectric layer. Preferably the etch rate ratio of the DARC layer to the low k dielectric layer is greater than 5:1, preferably greater than 10:1. In one embodiment, the cleaning composition comprises an effective amount of trimethylammonium fluoride (TMAF) to selective etch the ARC layer and post-etch polymer material. In another embodiment, the composition comprises effective amounts of TMAF and hydrogen fluoride (HF). In a further embodiment, effective amounts of TMAF and trimethylammonium hydroxide (TMAH) are combined to form the cleaning composition.

In another aspect, the invention provides a method of forming a conductive plug (via plug) and/or interconnect or contact. In one embodiment, the method includes providing a wafer comprising a substrate with an active area such as a metal line and overlying layers of low k dielectric layer, a dielectric antireflective coating (DARC) layer, and a photoresist layer; forming a opening through the low k dielectric layer to the active area on the substrate; and contacting the wafer with a cleaning solution to selectively remove the dielectric antireflective coating layer and post-etch polymer material with substantially no etching of the low k dielectric layer. A conductive metal can then be deposited to fill the opening (and/or trench) to form a conductive plug and a metal line (interconnect, contact). The method can be used to form single or dual damascene interconnects and via plugs in the manufacture of integrated circuits.

In yet another aspect, the invention provides a cleaning composition comprising one or more cleaning agents in amounts effective to selectively remove a dielectric antireflective coating (DARC) layer overlying a carbon-doped low k dielectric layer at an etch rate of the DARC layer to the low k dielectric layer that is greater than the etch rate ratio of the DARC material to TEOS. In one embodiment, the cleaning composition is formulated such that contact of the cleaning composition with a carbon-doped low k dielectric blanket layer for a time period of up to about 15 minutes results in no measurable removal of a carbon-doped low k dielectric layer. In other embodiments, the cleaning composition comprises about 10 to about 40 wt % TMAF and, optionally, about 0 to about 10 wt % HF, or about 0 to about 25 wt % TMAH. The cleaning composition can have a pH over a range of about 3.5 to about 14.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

An embodiment of a method of the present invention is described with reference to FIGS. 1–6. As shown, a dual damascene process is used to form a via and interconnect associated with an active area of a semiconductor circuit. It is understood that the method of the invention can be used in a single damascene process or other process to form a via plug or metal line.

The via plug/metal line is illustrated and will be described as being coupled to a conductive area 16, but can be used wherever required within the structure of a semiconductor circuit.

Figure 1:
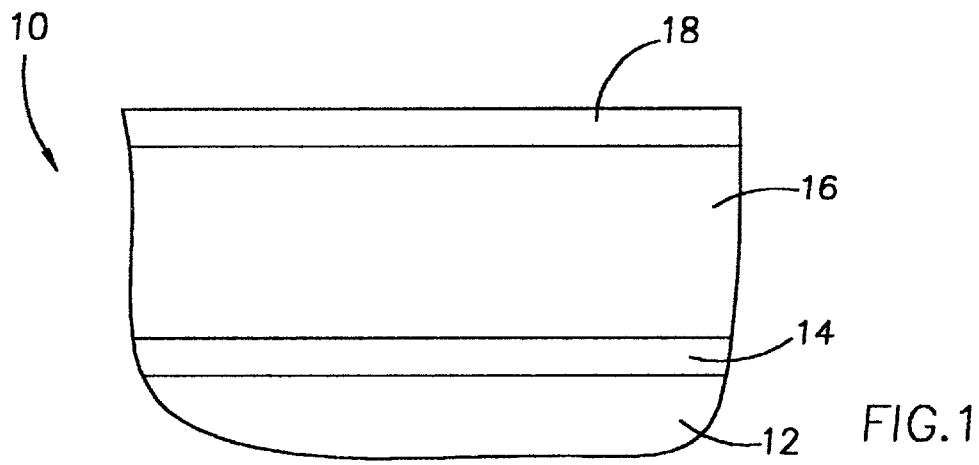
FIG. 1 is a diagrammatic cross-sectional view of a semiconductor wafer fragment at a preliminary step of a processing sequence.

Referring to FIG. 1, a wafer fragment 10 is shown at a preliminary processing step. The wafer fragment 10 in progress can comprise a semiconductor wafer substrate or the wafer along with various process layers formed thereon, including one or more semiconductor layers or other formations, and active or operable portions of semiconductor devices.

The wafer fragment 10 is shown as comprising a substrate 12, a conductive (active) area 14, an overlying interlayer dielectric (ILD) layer 16, and an overlying dielectric anti-reflective coating (DARC) layer 18. An exemplary substrate 12 is monocrystalline silicon. The conductive area 14 can comprise a conductor or semiconductor material, for example, a doped silicon region such as a source/drain region, or an underlying conductive runner or wiring layer, as shown in the illustrated example. The wiring layer can comprise, for example copper or aluminum, or other conductive metal depending upon the function and desired conductivity of the circuit element.

The interlayer dielectric (ILD) layer 16 comprises a low k oxide material formed over the conductive area 14, typically to a thickness of about 2,000 to about 10,000 angstroms. The ILD layer 16 comprises a modified silicon oxide ($SiO_2$) insulation layer that can be formed using a carbon-substituted silane precursor such as trimethylsilane (TMS). The ILD layer 16 preferably has a dielectric constant of about 2.5 to about 3.5.

An exemplary process for forming a carbon doped low k silicon oxide ILD layer 16 comprises flowing into a chemical vapor deposition (CVD) chamber, about 60 to about 1000 sccm TMS, with an oxygen source such $N_2O$ at about 200 to about 1000 sccm, or $O_2$ at about 50 to about 500 sccm, combined with helium (He) to dilute the gases at a flow rate of about 200 to about 1,000 sccm or higher, preferably with plasma enhancement. In an example and preferred process, about 60 to about 150 sccm TMS, about 300 to about 500 sccm $N_2O$, and about 300 to 500 sccm He are flowed into the deposition chamber. In another example and preferred process, about 500 to about 700 sccm TMS with about 80 to out 150 sccm $O_2$ are flowed into the reaction chamber. A standard CVD chamber can be used, such as a DxZ chamber (Applied Materials). Preferred processing conditions include a temperature of about 300° C. to about 450° C., a pressure of about 3 Torr to about 7 Torr, and an rf power of about 200 W to about 800 W.

The dielectric antireflective coating (DARC) layer 18 is deposited over the low k carbon doped ILD layer to a thickness to provide anti-reflective properties, typically about 150 to about 650 angstroms or more. In a photolithography process, the DARC layer 18 aids in preventing undesirable light reflection during a step of "setting" a photoresist layer, and also prevents profile distortion. Preferably, the DARC layer 18 reduces reflected radiation reaching an overlying layer of photoresist to less than about 10% or as low as less than 1%, depending on the process sensitivity of incident radiation at the DARC layer 18.

A variety of DARC materials can be used that absorb various wavelengths of radiation. Preferably, the DARC layer comprises a silicon-rich oxide or a silicon-rich oxynitride. The DARC layer 18 preferably comprises amounts of silicon, oxygen, and nitrogen, optionally with an amount of hydrogen, to form a silicon-rich oxynitride film of $Si_xO_yN_z$:H, preferably where x=0.30 to 0.65, y=0.02 to 0.56, and z is 0.05 to 0.33, or a silicon-rich oxide $Si_xO_y$:H, preferably where x=0.30 to 0.65, and y=0.25 to 0.60. The relative values of x, y and z and the hydrogen content can be adjusted to alter absorbence characteristics of the deposited layer. Exemplary DARC films include silicon, oxygen and nitrogen DARC materials disclosed, for example, in U.S. Pat. Nos. 6,225,671 (Yin), 6,268,282 (Sandhu et al.), and 5,698,352 (Ogawa et al.).

The DARC layer 18 can be deposited by known processes, such as CVD or preferably by plasma-enhanced CVD (PECVD) including, for example, electron cyclotron resonance (ECR) PECVD, and bias ECR PECVD processes. Exemplary conditions for depositing the DARC layer 18 include flowing a silicon-containing precursor such as silane ($SiH_4$) at a rate of about 40 to about 300 sccm, preferably about 60 to about 225 sccm, preferably about 80 sccm; an oxygen source gas such as nitrous oxide ($N_2O$) or oxygen ($O_2$) at a rate of about 80 to about 600 sccm, preferably about 95 to about 550 sccm, preferably about 80 sccm; with argon, helium or other inert gas at a rate of about 1300 to about 2500 sccm, preferably about 2200 sccm, depending on the photo requirements of the DARC film. The gases can be flowed into a plasma-enhanced CVD chamber at a temperature of about 400° C., under a pressure of about 4 Torr to about 6.5 Torr, and an rf power to the chamber of about 50 to about 200 watts, preferably about 100 watts.

Figure 2:
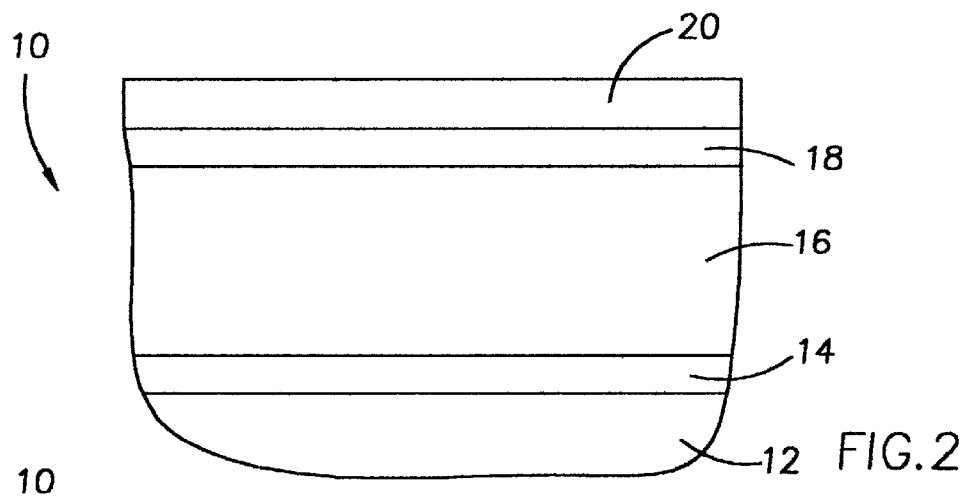
FIGS. 2–6 are views of the wafer fragment of FIG. 1 at subsequent and sequential processing steps, showing fabrication of a via plug and metal line according to an embodiment of the method of the invention.

As shown in FIG. 2, a photoresist layer 20 is formed over the DARC layer 18 by known techniques, for example, a spin-on process. The photoresist layer 20 can comprise either a positive or negative photoresist. Exemplary photoresists comprise an organic polymeric material, and include those comprising a novolac resin, a diazonaphthaquinone, and a solvent (e.g., n-butyl alcohol or xylene), and negative photoresist materials such as those comprising a cyclized synthetic rubber resin, bis-arylazide, and an aromatic solvent.

Figure 3:
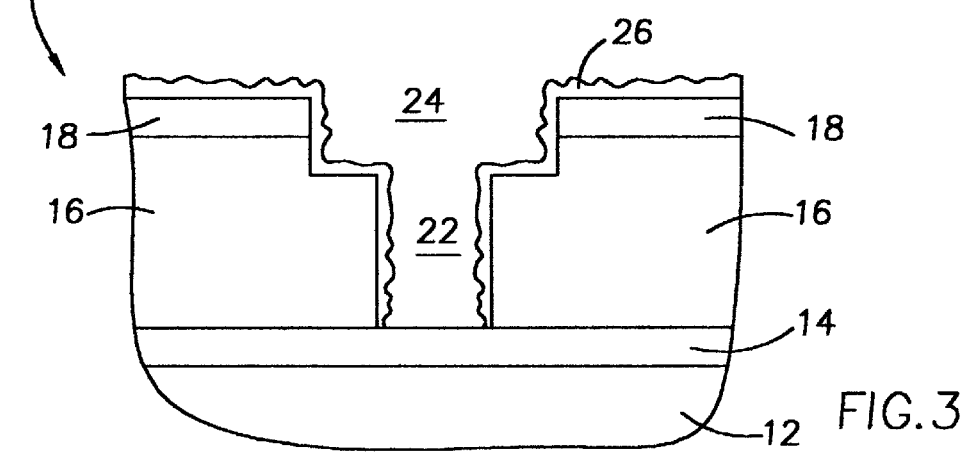

As shown in FIG. 3, the ILD layer 16 and the DARC layer 18 can then be patterned and etched using a known two-tier etch process, typical when forming damascene contacts, to form dual inlaid openings that include a contact opening or via 22 and an interconnect channel or trench 24. Etching of the ILD and DARC layers can be performed using known techniques, for example, a plasma etch using one or more of $Cl_2$, HBr, $CF_4$, $CH_2F_2$, and helium and $NF_3$. Typically, a trench or groove 24 is etched into the ILD layer 16, and then the contact opening 22 is etched to extend to the underlying conductive (active) region 14 in the substrate. The trench 24 forms a channel from the contact opening 22 to other circuit elements (not shown). Typically, the contact opening 22 has a width less than about 0.25 $\mu$m, more preferably less than about 0.20 $\mu$m, resulting in an aspect ratio greater than about 0.5, preferably greater than about 8. The photoresist is removed through an oxygen plasma ashing step, a wet piranha ($H_2SO_4/H_2O_2$ mixture) step, or a combination of both.

Figure 4:
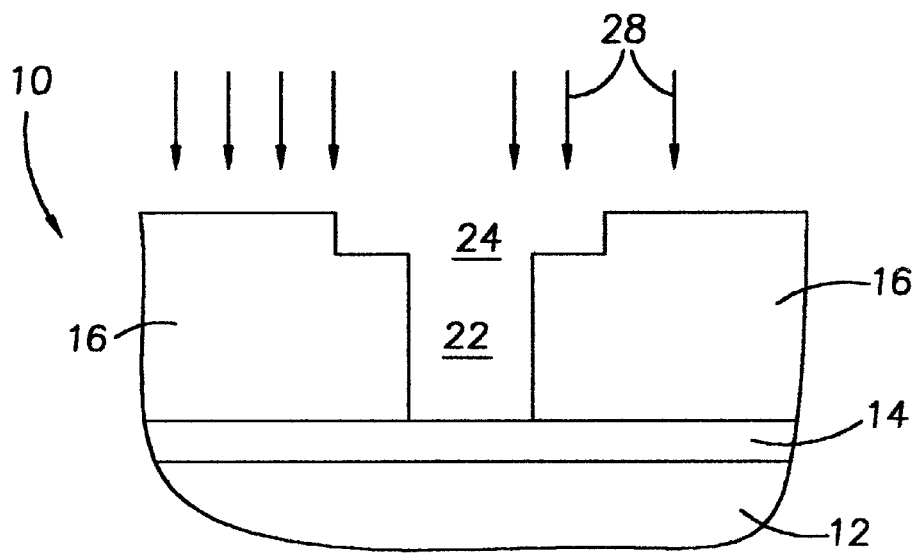

Referring to FIG. 4, once the etch step and photoresist strip step are completed, a post-etch cleaning (arrows 26) is performed using a single step wet etch to selectively remove the DARC layer 18 and any remaining post-etch polymer 26. Post-etch polymer 26 generally comprises the polymer residue by-products remaining after the etch and photoresist strip.

According to the invention, the wet etch cleaning composition comprises relative amounts of one or more cleaning agents to selectively etch the DARC layer 18 at a desired rate without substantially etching the ILD layer 16. The wet etch composition can have a pH over a range of about 3.5 to about 14, and is preferably about pH 6.5. The cleaning composition preferably comprises tetramethylammonium fluoride (TMAF), a mixture of TMAF and hydrogen fluoride (HF), or a mixture of TMAF and trimethylammonium hydroxide (TMAH).

In one embodiment, the cleaning composition comprises an effective amount of tetramethylammonium fluoride (TMAF) to selectively remove the DARC layer 18 and post-etch polymer 26 relative to the low k dielectric layer 16. Preferably, the cleaning composition comprises about 10 to about 40 wt % TMAF. The TMAF solution can be prepared by known methods in the art. For example, a TMAF cleaning composition can be prepared by combining a standard aqueous (49 wt %) HF solution with a standard aqueous (25 wt %) TMAH solution in an effective volume ratio concentration such that the resultant composition preferably comprises about 10 to about 40 wt % TMAF.

In another embodiment, the cleaning composition can comprise an effective amount of TMAF combined with an amount of hydrogen fluoride (HF), to selectively remove the DARC layer 18 and post-etch polymer material 26. Preferably, the cleaning composition comprises about 10 to about 40 wt % TMAF and up to about 10 wt % HF. The TMAF/HF cleaning composition can be prepared, for example, by combining an aqueous TMAF solution with about up to about 10 wt % of a standard aqueous (49 wt %) HF solution. In another example, the cleaning composition can also be prepared by combining TMAH (25 wt % solution) with an excess amount of HF (49 wt % solution) to form a TMAF and HF cleaning composition. An example and preferred composition comprises a volume ratio concentration of TMAH (25 wt %):HF (49 wt %) of about 4:1 to about 11:1, preferably about a 9:1 volume ratio.

In yet another embodiment, the cleaning composition is formulated with effective amounts of TMAF and TMAH cleaning agents to selectively remove the DARC layer 18 and post-etch polymer material 26. Preferably, the cleaning composition comprises about 10 to about 40 wt % TMAF and up to about 25 wt % TMAH. The TMAF/TMAH cleaning composition can be prepared by combining a standard aqueous (25 wt %) TMAH solution with an aqueous TMAF solution.

To avoid undesirable modification of the critical dimensions (CD) of the etched features, the cleaning composition comprises amounts of the cleaning agents to provide an etch selectivity ratio of the DARC layer to the low k ILD layer (DARC:low k ILD) that is greater than the DARC:TEOS etch rate ratio of the particular DARC material that is utilized, to limit etching of the low k ILD layer, preferably to about zero (0) to less than 50 angstroms. The etch rates of various DARC materials are shown in Table 1 of the Example. Preferably, the etch rate ratio of the DARC:low k ILD layer is greater than 2:1, preferably greater than 5:1, preferably about 9:1 to about 11:1 or greater, and more preferably about 100:1 to about 1,000:1 or greater. The cleaning composition provides effective and easy removal of the DARC layer 18 and post-etch polymer 26 while controlling the etch rate of other wafer regions such that essentially no etching of the ILD layer 16 occurs during the cleaning step.

The cleaning composition can be applied to the wafer in various ways. For example, the cleaning composition can be sprayed onto the wafer, or the wafer can be dipped or immersed into a bath of the cleaning composition, among others.

The cleaning composition can be used at a temperature of about 5 to about 65° C., preferably about 20 to about 50° C. The length of the contact of the cleaning composition with the wafer surface generally depends on the thickness and the character of the DARC layer. For example, a 6-minute dip using a 9:1 volume ratio of TMAH (25 wt %):HF (49 wt %) can be used to remove about 600 angstroms of a DARC film, with the wet etch rate for the low k ILD layer being about zero (0). By comparison, in six (6) minutes, the foregoing composition typically removes about 200 angstroms of a TEOS deposited layer, which causes CD loss of features etched in a TEOS ILD layer. The contact time of the composition generally ranges from about 1 to about 15 minutes.

Figure 5:
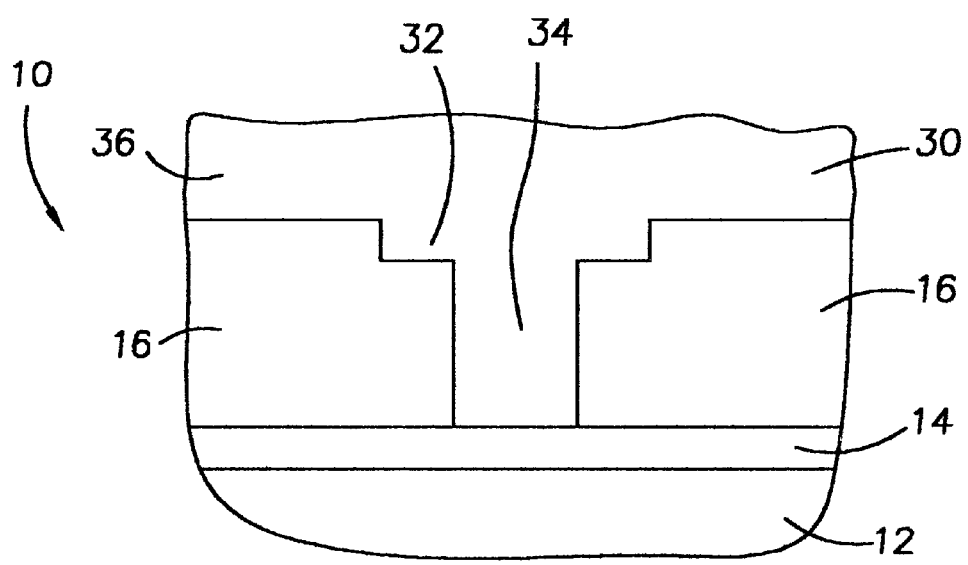
Figure 6:
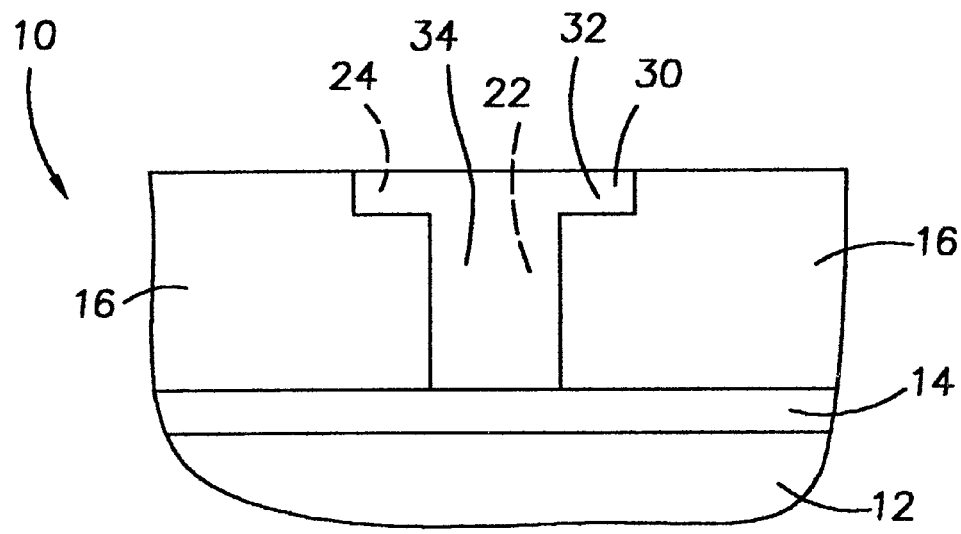

After the cleaning step, a conductive metal layer 30 can then be deposited to fill the trench 24 and the contact opening 22, as shown in FIG. 5. Examples of conductive metals include aluminum, copper, and tungsten. The conductive metal 30 can be deposited by conventional methods, such as physical vapor deposition (PVD) (sputtering) or CVD. The metal layer 36 can be subsequently planarized by chemical mechanical planarization (CMP) or etched back so that the metal remains isolated in paths within the trench 24 and opening 22, resulting in the metal line (interconnect or contact) 32, conducting plug 34, and metal layer 36, as depicted in FIG. 6.

In another embodiment of the method of the invention, a single opening or via can be etched through the ILD layer, cleaned with the cleaning composition, and filled with a conductive metal to form a via plug, as depicted in FIGS. 7–10.

Figure 7:
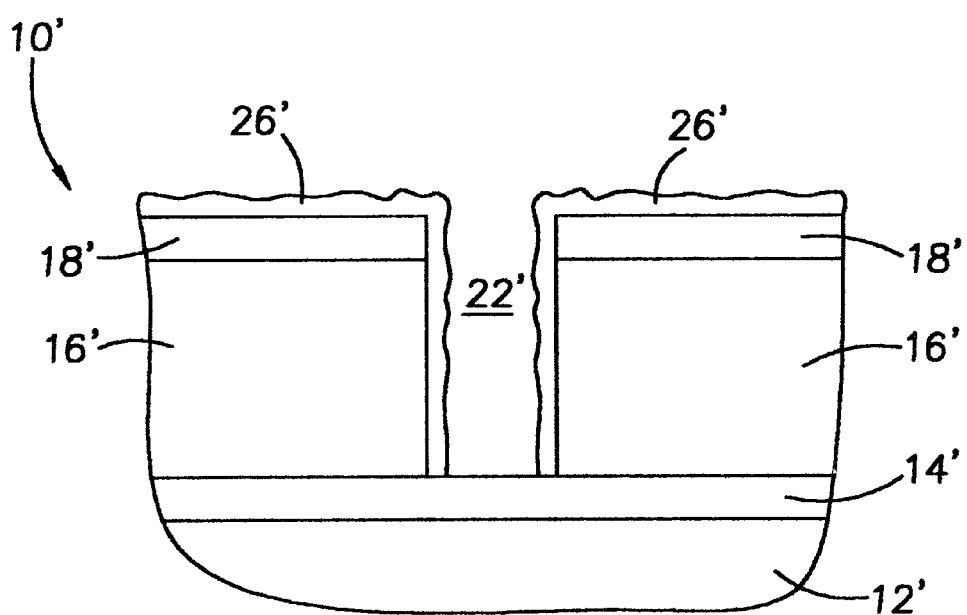
FIGS. 7–10 depict another embodiment of the method of the invention in the formation of a via plug, showing steps in the subsequent and sequential processing of the wafer fragment of FIGS. 1–2.
Figure 8:
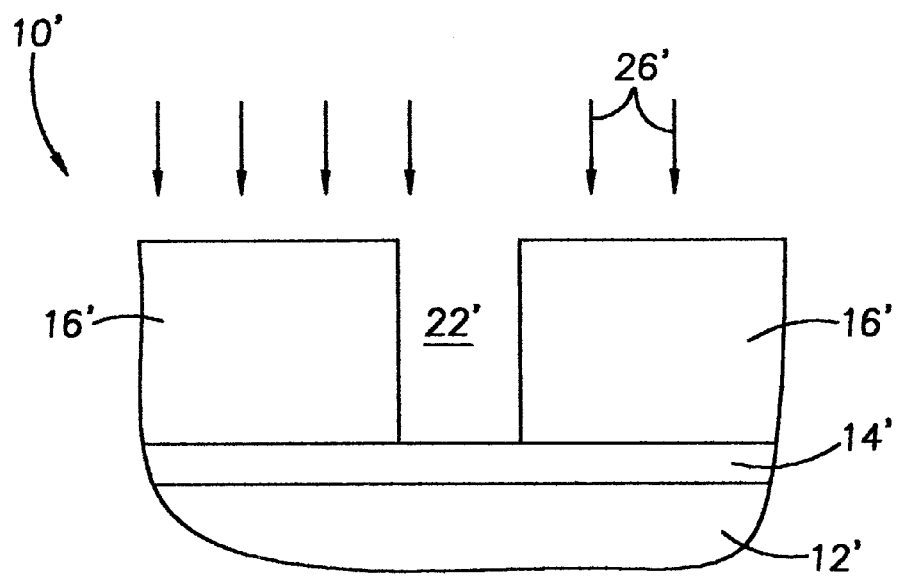

For example, the wafer fragment shown in FIG. 2, having a low k dielectric (ILD) layer 16', DARC layer 18', and overlying photoresist layer 20', can be patterned and etched to form a single opening or via 22', as illustrated in FIG. 7. Referring to FIG. 8, after the etch step and a photoresist strip step, a post-etch cleaning (arrows 26') can then be performed using the cleaning composition of the invention to selectively etch the DARC layer 18' and any post-etch polymer 26', with little or no etching of the low k ILD layer 16', preferably removing less than 50 angstroms of the ILD layer.

Figure 9:
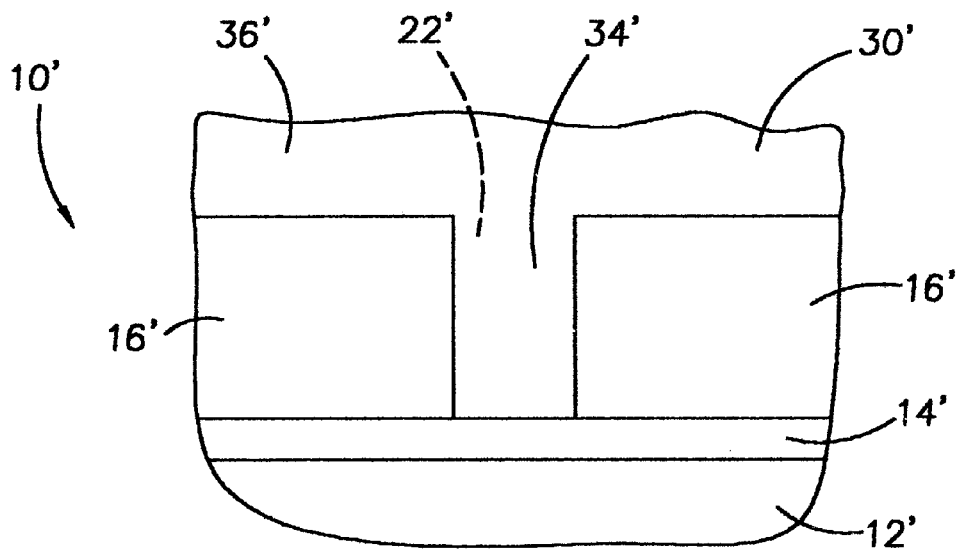
Figure 10:
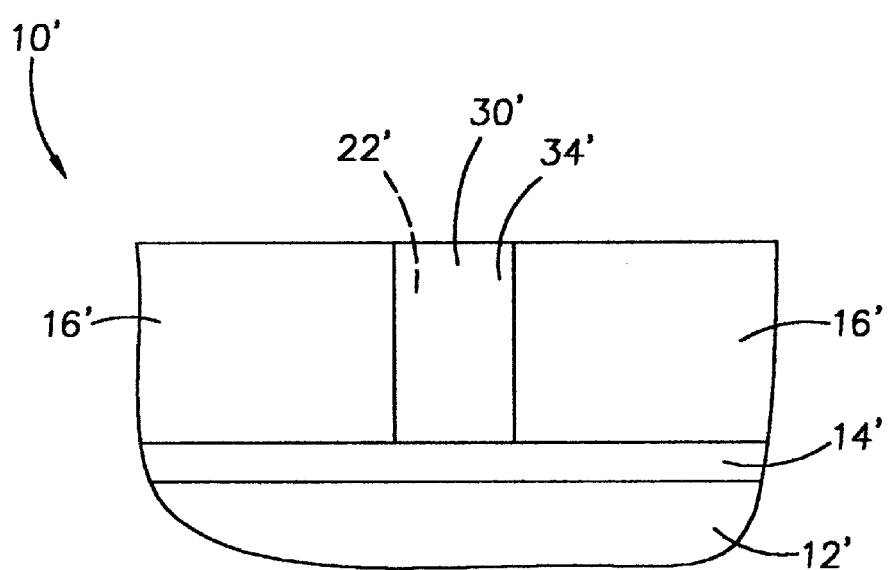

Thereafter, a conductive metal layer 30' can be deposited to fill the opening 22', as shown in FIG. 9. The metal layer 36' can be subsequently planarized by CMP or etched back so that the metal remains isolated in the contact opening 22', resulting in the conducting plug 34', as shown in FIG. 10.

EXAMPLE

Wafers were provided with various oxide film layers and DARC film layers, as shown in Table 1 below. The wafers were immersed for 6 minutes in a bath containing a 9:1 volume ratio TMAH:HF solution (25 wt % TMAH solution; 49 wt % HF solution). The pH of the solution was 6.5, and the bath temperature was 21.5° C.

TABLE 1

| Film type | Thickness $\Delta^1$ (angstroms) |
| --- | --- |
| Thermal oxide | 33 |
| Rich BPSG, annealed | 74 |
| TEOS, as deposited | 223 |
| 320 DARC | 330 |
| I-line DARC | 454 |
| DUV DARC | 740 |
| HER DARC | >1006 |
| Fuse DARC | 547 |
| Low k film | 0 |

"Thickness $\Delta$" is the change in thickness of the films by the wet etch step.

All DARC films were stripped and piranhaed before being tested. The low k film was not etched at all during a 15 minute dip.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive structure, comprising the steps of:
   providing a wafer comprising a substrate and an overlying low k dielectric layer;
   forming a layer of dielectric antireflective coating over the low k dielectric layer;
   forming a photoresist layer over the dielectric antireflective coating layer;
   etching an opening through the low k dielectric layer to an active area on the substrate; and
   contacting the wafer with a cleaning solution comprising trimethylammonium fluoride to selectively remove the dielectric antireflective coating layer and post-etch polymer material.

2. The method of claim 1, wherein the cleaning solution comprises an amount of trimethylammonium fluoride to provide an etch rate ratio of the dielectric antireflective coating layer to the low k dielectric layer greater than the etch rate ratio of the dielectric antireflective coating layer to a TEOS layer.

3. The method of claim 2, wherein the etch rate is greater than 2:1.

4. The method of claim 2, wherein the etch rate is greater than 5:1.

5. The method of claim 2, wherein the etch rate is greater than 0:1.

6. The method of claim 2, wherein the cleaning solution comprises about 10 to about 40 wt % of trimethylammonium fluoride.

7. The method of claim 2, wherein the cleaning solution further comprises hydrogen fluoride.

8. The method of claim 7, wherein the cleaning solution comprises about 10 to about 40 wt % of trimethylammonium fluoride and up to about 10 wt % hydrogen fluoride.

9. The method of claim 2, wherein the cleaning solution further comprises trimethylammonium hydroxide.

10. The method of claim 9, wherein the cleaning solution comprises about 10 to about 40 wt % of trimethylammonium fluoride and about 0 to about 25 wt % trimethylammonium hydroxide.

11. The method of claim 1, wherein the cleaning solution has a pH of about 3.5 to about 14.

12. The method of claim 1, wherein the temperature of the cleaning solution is about 5° C. to about 65° C.

13. The method of claim 1, wherein the temperature of the cleaning solution is about 20° C. to about 50° C.

14. The method of claim 1, wherein the contacting step is for a time period effective to remove the dielectric antireflective coating layer and the post-etch polymer with substantially no etching of the low k dielectric layer.

15. The method of claim 14, wherein the contacting step comprises removing up to about 600 angstroms of the dielectric antireflective coating layer within an about six minute time period.

16. The method of claim 14, wherein the contacting step comprises an about 1 to about 15 minute time period.

17. The method of claim 14, wherein the contacting step results in etching of less than 50 angstroms of the low k dielectric layer.

18. The method of claim 1, wherein the contacting step comprises dipping the wafer in the cleaning solution.

19. The method of claim 1, wherein the contacting step comprises spraying the cleaning solution onto the wafer.

20. The method of claim 1, further comprising after the contacting step, the step of depositing a conductive material to fill the opening.

21. A method of forming a conductive structure, comprising the steps of:
   providing a wafer comprising a substrate, an overlying carbon doped low k dielectric layer, an overlying dielectric antireflective coating layer, and an opening formed through said layers to the substrate; and
   contacting the wafer with a cleaning solution comprising an amount of trimethylammonium fluoride to selectively etch the dielectric antireflective coating layer and overlying polymer material.

22. The method of claim 21, wherein the cleaning solution provides an etch rate ratio of the dielectric antireflective coating layer to the low k dielectric layer greater than the etch rate ratio of the dielectric antireflective coating layer to a TEOS layer.

23. The method of claim 22, wherein the rate of etching the dielectric antireflective coating layer to the rate of etching the low k dielectric layer is a ratio greater than about 5:1.

24. The method of claim 22, wherein the rate of etching the dielectric antireflective coating layer to the rate of etching the low k dielectric layer is a ratio greater than about 10:1.

25. The method of claim 21, wherein the contacting step is for a time period of about 1 to about 15 minutes, and less than 50 angstroms of the dielectric layer is etched.

26. A method of forming a conductive structure, comprising the steps of:
    forming a carbon doped low k dielectric layer over a substrate of a wafer;
    forming a dielectric antireflective coating layer over the low k dielectric layer;
    forming a photoresist layer comprising an organic polymer material over the dielectric antireflective coating layer;
    etching an opening through the dielectric layer to the substrate; and
    contacting the wafer with a cleaning solution comprising an effective amount of trimethylammonium fluoride to selectively remove the dielectric antireflective coating layer and post-etch polymer.

27. The method of claim 26, wherein the cleaning solution provides an etch rate ratio of the dielectric antireflective coating layer to the low k dielectric layer of greater than 5:1.

28. The method of claim 26, wherein the cleaning solution provides an etch rate ratio of the dielectric antireflective coating layer to the low k dielectric layer of greater than 0:1.

29. The method of claim 26, wherein the cleaning solution comprises about 10 to about 40 wt % of trimethylammonium fluoride.

30. The method of claim 29, wherein the cleaning solution further comprises up to about 10 wt % hydrogen fluoride.

31. The method of claim 29, wherein the cleaning solution further comprises up to about 25 wt % trimethylammonium hydroxide.

32. The method of claim 26, wherein the step of forming the carbon-doped low k dielectric layer comprises depositing a carbon-substituted silane source gas and an oxygen source gas onto the substrate.

33. The method of claim 32, wherein the silane source gas comprises trimethylsilane, and the oxygen source is selected from the group consisting of $N_2O$ and $O_2$.

34. The method of claim 32, wherein the step of forming the low k dielectric layer comprises flowing about 60 to about 1000 sccm of the silane source gas, and about 50 to about 500 sccm of the oxygen source gas over the substrate.

35. The method of claim 34, wherein the step of forming the low k dielectric layer further comprises flowing about 200 to about 1000 sccm of helium.

36. The method of claim 26, wherein the step of forming the low k dielectric layer comprises flowing about 60 to about 1000 sccm trimethylsilane and about 200 to about 1000 sccm $N_2O$.

37. The method of claim 36, wherein the step of forming the low k dielectric layer further comprises flowing about 200 to about 1000 sccm of helium.

38. The method of claim 26, wherein the step of forming the low k dielectric layer comprises flowing about 500 to about 700 sccm trimethylsilane, and about 80 to about 150 sccm $O_2$.

39. The method of claim 26, wherein the step of forming the low k dielectric layer is at a temperature of about 300° C. to about 450° C.

40. The method of claim 26, wherein the step of forming the low k dielectric layer comprises plasma enhanced chemical vapor deposition.

41. The method of claim 26, wherein the low k dielectric layer has a dielectric constant of about 2.5 to about 3.5.

42. The method of claim 26, wherein the step of forming the dielectric antireflective coating layer comprises depositing a plasma comprising a silicon source gas and an oxygen source gas.

43. The method of claim 42, wherein the step of forming the dielectric antireflective coating layer comprises flowing about 40 to about 300 sccm of a silicon source gas, and about 80 to about 600 sccm of an oxygen source gas.

44. The method of claim 42, wherein the silicon source gas comprises silane, and the oxygen source gas comprises $N_2O$.

45. The method of claim 26, wherein the dielectric antireflective coating layer comprises silicon-rich oxynitride or a silicon-rich oxide.

46. The method of claim 45, wherein the dielectric antireflective coating layer comprises a silicon-rich oxynitride having the formula $Si_xO_yN_z$:H where x is 0.30 to 0.65, y is 0.02 to 0.56, and z is 0.05 to 0.33.

47. The method of claim 45, wherein the dielectric antireflective coating layer comprises a silicon-rich oxide having the formula $Si_xO_y$:H, where x is 0.30 to 0.65, and y is 0.25 to 0.60.

48. The method of claim 26, wherein the step of forming the dielectric antireflective coating layer comprises chemical vapor deposition.

49. The method of claim 26, wherein the step of forming the dielectric antireflective coating layer comprises plasma enhanced chemical vapor deposition.

50. The method of claim 26, wherein the photoresist layer comprises a novolac resin.

51. The method of claim 26, wherein the step of forming the opening comprises a plasma etch process.

52. The method of claim 26, wherein the step of etching the opening comprises a damascene etch process.

53. The method of claim 52, wherein the opening comprises a contact opening and a trench.

54. The method of claim 52, wherein the opening comprises a contact opening or via.

55. The method of claim 26, wherein the step of etching the opening comprises exposing an active area on the substrate.

56. The method of claim 55, wherein the active area comprises a metal line.

57. The method of claim 55, wherein the active area comprises a source/drain region.

58. A method of forming a dual damascene structure in a semiconductor device, comprising the steps of:
    providing a substrate comprising an active area;
    forming a low k dielectric layer over the active area;
    forming a dielectric antireflective coating layer over the low k dielectric layer;
    forming a photoresist layer over the dielectric antireflective coating layer;
    etching the insulating layer to form a trench and an opening extending to the active area in the substrate; and
    selectively removing post-etch polymer and the dielectric antireflective coating layer with a cleaning solution comprising trimethylammonium fluoride in an amount effective to selectively etch the dielectric antireflective coating layer to the low k dielectric layer at an etch rate ratio of greater than 5:1.

59. The method of claim 58, wherein the etch rate ratio is greater than 10:1.

60. The method of claim 58, wherein the cleaning solution comprises about 10 to about 40 weight % trimethylammonium fluoride.

61. The method of claim 60, wherein the cleaning solution further comprises up to about 10 weight % hydrogen fluoride.

62. The method of claim 60, wherein the cleaning solution further comprises up to about 25 wt % trimethylammonium hydroxide.

63. A semiconductor processing method, comprising the steps of:
providing a substrate comprising an active area;
chemical vapor depositing a carbon-doped low k dielectric layer over a substrate by flowing about 60 to about 700 sccm of a carbon-substituted silane source gas, and about 100 to about 1000 sccm of an oxygen source gas over the active area on the substrate;
chemical vapor depositing a dielectric antireflective coating layer comprising silicon-rich oxynitride or silicon-rich oxide over the dielectric layer,
forming a layer of photoresist over the dielectric antireflective coating layer;
photolithographically patterning the photoresist layer to form a patterned masking layer;
etching the low k dielectric layer to form an opening therethrough to the active area on the substrate; and
applying a cleaning solution comprising trimethylammonium fluoride for a time effective to selectively remove the dielectric antireflective coating layer and post-etch polymer at an etch rate ratio of the dielectric antireflective coating layer to the low k dielectric layer of greater than 5:1.

64. The method of claim 63, wherein the etch rate ratio of the dielectric antireflective coating layer to the low k dielectric layer of greater than 10:1.

65. The method of claim 63, wherein the low k dielectric layer has a dielectric constant of about 2.5 to about 3.5.

66. The method of claim 63, wherein the cleaning solution comprises about 10 to about 40 wt % trimethylammonium fluoride.

67. The method of claim 66, wherein the cleaning solution further comprises up to about 10 wt % hydrogen fluoride.

68. The method of claim 66, wherein the cleaning solution further comprises about 0 to about 25 wt % trimethylammonium hydroxide.

69. The method of claim 63, wherein the applying step comprises removing up to about 600 angstroms of the dielectric antireflective coating layer and substantially no measurable removal of the low k dielectric layer over an about 6 minute time period.

70. The method of claim 63, wherein less than 50 angstroms of the low k dielectric layer is removed.

71. The method of claim 63, wherein the step of depositing the low k dielectric layer comprises flowing about 60 to about 150 sccm trimethylsilane, and about 300 to about 500 sccm $N_2O$.

72. The method of claim 63, wherein the step of depositing the low k dielectric layer comprises flowing about 500 to about 700 sccm trimethylsilane, and about 80 to about 150 sccm $O_2$.

73. A method of forming a conductive structure, comprising the steps of:
providing a wafer comprising a substrate and an overlying dielectric layer;
forming a layer of dielectric antireflective coating over the dielectric layer;
forming a photoresist layer over the dielectric antireflective coating layer;
etching an opening through the dielectric layer to an active area on the substrate; and
contacting the wafer with a cleaning solution comprising one or more cleaning agents in amounts effective to selectively remove the dielectric antireflective coating layer at an etch rate ratio of the dielectric antireflective coating layer to the dielectric layer greater than an etch rate ratio of the dielectric antireflective coating layer to a TEOS layer.

74. A method of forming a conductive structure, comprising the steps of:
providing a wafer comprising a substrate and an overlying dielectric layer;
forming a layer of dielectric antireflective coating over the dielectric layer;
forming a photoresist layer over the dielectric antireflective coating layer;
etching an opening through the dielectric layer to an active area on the substrate; and
contacting the wafer with a cleaning solution comprising one or more cleaning agents in amounts effective to selectively remove the dielectric antireflective coating layer at an etch rate ratio of the dielectric antireflective coating layer to the dielectric layer of greater than 2:1.

75. A method of forming a conductive structure, comprising the steps of:
providing a wafer comprising a substrate and an overlying dielectric layer;
forming a layer of dielectric antireflective coating over the dielectric layer;
forming a photoresist layer over the dielectric antireflective coating layer;
etching an opening through the dielectric layer to an active area on the substrate; and
contacting the wafer with a cleaning solution comprising trimethylammonium fluoride to selectively remove the dielectric antireflective coating layer with substantially no etching of the dielectric layer at an etch rate ratio of the dielectric antireflective coating layer to the dielectric layer of greater than 2:1.

76. A method of forming a conductive structure, comprising the steps of:
providing a wafer comprising a substrate and an overlying dielectric layer;
forming a layer of dielectric antireflective coating over the dielectric layer;
forming a photoresist layer over the dielectric antireflective coating layer;
etching an opening through the dielectric layer to an active area on the substrate; and
contacting the wafer with a cleaning solution comprising trimethylammonium fluoride to selectively remove the dielectric antireflective coating layer at an etch rate ratio of the dielectric antireflective coating layer to the dielectric layer of greater than 2:1; wherein during an about 1 to an about 15 minute contacting period, less than about 50 angstroms of the dielectric layer is etched.

77. A method of forming a conductive structure, comprising the steps of:

provided a wafer comprising a substrate and an overlying dielectric layer;

forming a layer of dielectric antireflective coating over the dielectric layer;

forming a photoresist layer over the dielectric antireflective coating layer;

etching an opening through the dielectric layer to an active area on the substrate; and contacting the wafer with a cleaning solution to selectively remove the dielectric antireflective coating layer at an etch rate ratio of the dielectric antireflective coating layer to the dielectric layer of greater than 2:1, wherein during an about 1 to an about 15 minute contacting period, less than about 50 angstroms of the dielectric layer is etched; the cleaning solution comprising about 10 to about 40 wt % of trimethylammonium fluoride and about 0 to about 10 wt % hydrogen fluoride.

78. A method of forming a conductive structure, comprising the steps of:

providing a wafer comprising a substrate and an overlying dielectric layer;

forming a layer of dielectric antireflective coating over the dielectric layer;

forming a photoresist layer over the dielectric antireflective coating layer;

etching an opening through the dielectric layer to an active area on the substrate; and contacting the wafer with a cleaning solution to selectively remove the dielectric antireflective coating layer to provide an etch rate ratio of the dielectric antireflective coating layer to the dielectric layer of greater than 2:1, wherein during an about 1 to an about 15 minute contacting period, less than about 50 angstroms of the dielectric layer is etched; the cleaning solution comprising about 10 to about 40 wt % of trimethylammonium fluoride and about 0 to about 25 wt % trimethylammonium hydroxide.

* * * * *

UNITED STATES PATENT AND TRADEMARK OFFICE
CERTIFICATE OF CORRECTION

PATENT NO. : 6,573,175 B1
DATED : June 3, 2003
INVENTOR(S) : Zhiping Yin and Gary Chen It is certified that error appears in the above-identified patent and that said Letters Patent is hereby corrected as shown below:

Column 2,
Line 20, replace "ARC" with -- DARC --.

Column 8,
Line 16, replace "0:1" with -- 10:1 --.

Column 9,
Line 34, replace "0:1" with -- 10:1 --.

Signed and Sealed this

Ninth Day of September, 2003

JAMES E. ROGAN
*Director of the United States Patent and Trademark Office*